(12) United States Patent
Diaz

(10) Patent No.: US 10,398,058 B2
(45) Date of Patent: *Aug. 27, 2019

(54) ASSEMBLY FOR SUSPENDING AN ELECTRONIC DISPLAY

(71) Applicant: Manufacturing Resources International, Inc., Alpharetta, GA (US)

(72) Inventor: Marcos Diaz, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/167,589

(22) Filed: Oct. 23, 2018

(65) Prior Publication Data

US 2019/0059175 A1    Feb. 21, 2019

Related U.S. Application Data

(63) Continuation of application No. 15/062,880, filed on Mar. 7, 2016, now Pat. No. 10,143,106, which is a
(Continued)

(51) Int. Cl.
*H05K 7/20* (2006.01)
*F16M 11/00* (2006.01)
(Continued)

(52) U.S. Cl.
CPC ......... *H05K 7/20136* (2013.01); *F16M 11/00* (2013.01); *F16M 13/027* (2013.01);
(Continued)

(58) Field of Classification Search
CPC ....... G09F 2007/186; G09F 2007/1834; G09F 15/0037
(Continued)

(56) References Cited

U.S. PATENT DOCUMENTS 2,029,221 A    1/1936    Burgess et al.
2,678,860 A    5/1954    Peterson
(Continued)

FOREIGN PATENT DOCUMENTS

GB         153110       11/1920
JP      2005292939 A    10/2005
(Continued)

OTHER PUBLICATIONS

The Free Dictionary, Bolt—Definition of bolt by The Free Dictionary, Jun. 15, 2016, 1 Page.
(Continued)

*Primary Examiner* — Mukundbhai G Patel
(74) *Attorney, Agent, or Firm* — Standley Law Group LLP; Jeffrey S. Standley; Adam J. Smith

(57) ABSTRACT

An assembly for suspending an electronic display between a first structure located above the electronic display and a second structure located below the electronic display includes a housing for the electronic display. A plurality of elongate members each extend through the housing and are configured to extend from the first structure to the second structure. A substantially sealed compartment for circulating gas is positioned within the housing. A channel extends through the housing, is in thermal communication with the substantially sealed compartment, and is configured to receive ambient air. Clamps are provided which are each sized to accept one of the elongate members.

20 Claims, 14 Drawing Sheets

Related U.S. Application Data continuation of application No. 14/553,086, filed on Nov. 25, 2014, now Pat. No. 9,282,676.

(51) Int. Cl.

| | | |
|---|---|---|
| *H05K 5/00* | (2006.01) | |
| *G09F 9/30* | (2006.01) | |
| *G09F 27/00* | (2006.01) | |
| *F16M 13/02* | (2006.01) | |
| *G09F 7/18* | (2006.01) | |

(52) U.S. Cl.
CPC ............... *G09F 9/30* (2013.01); *G09F 27/00* (2013.01); *H05K 5/0017* (2013.01); *H05K 7/20972* (2013.01); *G09F 2007/186* (2013.01)

(58) Field of Classification Search
USPC .................................................... 361/679.02
See application file for complete search history.

(56) References Cited

U.S. PATENT DOCUMENTS

| | | | |
|---|---|---|---|
| 3,587,186 A | 6/1971 | Lane | |
| 3,984,931 A | 10/1976 | Belokin, Jr. | |
| 4,169,327 A | 10/1979 | Stilling | |
| 4,267,657 A | 5/1981 | Kloke | |
| 4,327,513 A | 5/1982 | de Gunzburg | |
| 4,452,000 A | 6/1984 | Gandy | |
| 4,547,987 A | 10/1985 | Stilling | |
| 4,759,143 A | 7/1988 | Pomerleau | |
| 4,817,317 A | 4/1989 | Kovalak, Jr. | |
| 4,903,423 A | 2/1990 | Hinca | |
| 4,905,390 A | 3/1990 | Stilling | |
| 5,025,355 A | 6/1991 | Harwood | |
| 5,179,367 A * | 1/1993 | Shimizu .................... G09F 7/18 |
| | | | 248/317 |
| 5,299,109 A | 3/1994 | Grondal | |
| 5,423,142 A | 6/1995 | Douglas et al. | |
| 5,457,905 A | 10/1995 | Kaplan | |
| 5,493,802 A | 2/1996 | Simson | |
| D373,120 S | 8/1996 | Andre et al. | |
| 5,717,424 A | 2/1998 | Simson et al. | |
| 5,755,050 A | 5/1998 | Aiken | |
| 5,803,424 A | 9/1998 | Keehn et al. | |
| 5,899,027 A | 5/1999 | St Louis | |
| D415,736 S | 10/1999 | Witte | |
| 6,050,833 A | 4/2000 | Danzyger et al. | |
| 6,172,869 B1 | 1/2001 | Hood, III et al. | |
| 6,198,222 B1 | 3/2001 | Chang | |
| 6,231,446 B1 | 5/2001 | Majima et al. | |
| 6,405,463 B1 | 6/2002 | Roddy et al. | |
| 6,469,752 B1 | 10/2002 | Ishikawa et al. | |
| D467,561 S | 12/2002 | Kosciolek | |
| 6,494,429 B2 | 12/2002 | Tajima | |
| 6,557,284 B2 | 5/2003 | Nolan | |
| 6,748,685 B2 | 6/2004 | Peel | |
| 6,758,002 B1 | 7/2004 | Duguay | |
| 6,962,528 B2 | 11/2005 | Yokota | |
| 6,976,330 B2 | 12/2005 | Milliken | |
| D530,686 S | 10/2006 | Reza | |
| 7,210,839 B2 | 5/2007 | Jung et al. | |
| D544,848 S | 6/2007 | Marz et al. | |
| 7,226,176 B1 | 6/2007 | Huang | |
| 7,292,435 B2 | 11/2007 | She | |
| 7,339,782 B1 | 3/2008 | Landes et al. | |
| 7,513,830 B2 | 4/2009 | Hajder et al. | |
| D595,678 S | 7/2009 | Dunn | |
| 7,589,958 B2 | 9/2009 | Smith | |
| 7,591,508 B2 | 9/2009 | Chang | |
| 7,601,067 B2 | 10/2009 | Anderson | |
| 7,609,506 B2 | 10/2009 | Aguirre | |
| D608,775 S | 1/2010 | Leung | |
| 7,768,775 B2 | 8/2010 | Kim | |
| D635,614 S | 4/2011 | Yan | |
| 7,985,139 B2 | 7/2011 | Lind et al. | |
| 8,006,435 B2 | 8/2011 | DeBlonk et al. | |
| 8,016,452 B2 | 9/2011 | Dunn | |
| 8,116,081 B2 | 2/2012 | Crick, Jr. | |
| D657,421 S | 4/2012 | Yan | |
| D657,422 S | 4/2012 | Yan | |
| D669,938 S | 10/2012 | Lard et al. | |
| 8,300,203 B2 | 10/2012 | Nakamichi | |
| 8,351,014 B2 | 1/2013 | Dunn | |
| 8,373,841 B2 | 2/2013 | Dunn | |
| 8,400,608 B2 | 3/2013 | Takahashi | |
| 8,418,387 B2 | 4/2013 | Swatt et al. | |
| 8,472,191 B2 | 6/2013 | Yamamoto | |
| 8,537,302 B2 | 9/2013 | Dunn | |
| 8,654,302 B2 | 2/2014 | Dunn et al. | |
| D704,265 S | 5/2014 | Yan | |
| 8,767,165 B2 | 7/2014 | Dunn | |
| 8,804,091 B2 | 8/2014 | Dunn | |
| 8,854,595 B2 | 10/2014 | Dunn | |
| 9,119,330 B2 | 8/2015 | Hubbard | |
| 9,235,232 B2 | 1/2016 | King | |
| 9,282,676 B1 | 3/2016 | Diaz | |
| 9,313,447 B2 | 4/2016 | Dunn et al. | |
| 9,317,060 B2 | 4/2016 | Dunn et al. | |
| 9,655,289 B2 | 5/2017 | Dunn et al. | |
| 9,703,320 B2 | 7/2017 | Bowers et al. | |
| 9,823,690 B2 | 11/2017 | Bowers et al. | |
| 2001/0043290 A1 | 11/2001 | Yamamoto | |
| 2001/0043293 A1 | 11/2001 | Inoue | |
| 2002/0149714 A1 | 10/2002 | Anderson et al. | |
| 2003/0039094 A1 | 2/2003 | Sarkinen et al. | |
| 2004/0025389 A1 | 2/2004 | Peterson | |
| 2004/0103570 A1 | 6/2004 | Ruttenberg | |
| 2004/0212548 A1 | 10/2004 | Ruttenberg | |
| 2004/0257492 A1 | 12/2004 | Mai et al. | |
| 2005/0105178 A1 | 5/2005 | Kim | |
| 2005/0127796 A1 | 6/2005 | Olesen et al. | |
| 2006/0012985 A1 | 1/2006 | Archie, Jr. et al. | |
| 2006/0077636 A1 | 4/2006 | Kim | |
| 2006/0137294 A1 | 6/2006 | Waits et al. | |
| 2006/0215421 A1 | 9/2006 | Chang et al. | |
| 2006/0218828 A1 | 10/2006 | Schrimpf et al. | |
| 2007/0021217 A1 | 1/2007 | Wu | |
| 2007/0070615 A1 | 3/2007 | Joslin et al. | |
| 2007/0139574 A1 | 6/2007 | Ko et al. | |
| 2007/0253205 A1 | 11/2007 | Welker | |
| 2008/0002350 A1 | 1/2008 | Farrugia | |
| 2008/0100186 A1 | 5/2008 | Li | |
| 2008/0174456 A1* | 7/2008 | Warren ............... G09F 15/0037 |
| | | | 340/994 |
| 2008/0236005 A1 | 10/2008 | Isayev et al. | |
| 2008/0255901 A1 | 10/2008 | Carroll et al. | |
| 2008/0276507 A1 | 11/2008 | Hines | |
| 2008/0304219 A1 | 12/2008 | Chen | |
| 2009/0009041 A1 | 1/2009 | Zeidler | |
| 2009/0016004 A1 | 1/2009 | McCoy | |
| 2009/0104989 A1 | 4/2009 | Williams et al. | |
| 2009/0126906 A1* | 5/2009 | Dunn ................... G06Q 40/06 |
| | | | 165/104.31 |
| 2009/0135365 A1 | 5/2009 | Dunn | |
| 2009/0141199 A1 | 6/2009 | Fujikawa | |
| 2009/0231807 A1 | 9/2009 | Bouissiere | |
| 2009/0241388 A1 | 10/2009 | Dunn | |
| 2009/0278007 A1 | 11/2009 | Taylor | |
| 2009/0279240 A1 | 11/2009 | Karppanen | |
| 2010/0171889 A1 | 7/2010 | Pantel et al. | |
| 2010/0220249 A1 | 9/2010 | Nakamichi et al. | |
| 2011/0019348 A1 | 1/2011 | Kludt et al. | |
| 2011/0051071 A1 | 3/2011 | Nakamichi | |
| 2011/0114384 A1 | 5/2011 | Sakamoto et al. | |
| 2011/0116231 A1 | 5/2011 | Dunn et al. | |
| 2011/0134356 A1 | 6/2011 | Swatt et al. | |
| 2011/0141672 A1 | 6/2011 | Farley, Jr. et al. | |
| 2011/0227467 A1 | 9/2011 | Foppe, Jr. et al. | |
| 2012/0050958 A1 | 3/2012 | Sanford et al. | |
| 2012/0105424 A1 | 5/2012 | Lee et al. | |
| 2012/0253672 A1* | 10/2012 | Hoshino ............... G01C 21/20 |
| | | | 701/541 |
| 2013/0211583 A1 | 8/2013 | Borra | |

(56) References Cited

U.S. PATENT DOCUMENTS

| | | |
|---|---|---|
| 2013/0270975 A1 | 10/2013 | Dunn et al. |
| 2013/0294039 A1 | 11/2013 | Chao |
| 2014/0044147 A1 | 2/2014 | Wyatt et al. |
| 2014/0208626 A1 | 7/2014 | Moon |
| 2015/0264826 A1 | 9/2015 | Dunn et al. |
| 2015/0319882 A1 | 11/2015 | Dunn et al. |
| 2016/0192536 A1 | 6/2016 | Diaz |
| 2017/0074453 A1 | 3/2017 | Bowers et al. |
| 2017/0083043 A1 | 3/2017 | Bowers et al. |
| 2017/0231112 A1 | 8/2017 | Dunn et al. |

FOREIGN PATENT DOCUMENTS

| | | |
|---|---|---|
| JP | 2005332253 A | 12/2005 |
| JP | 2006198344 | 8/2006 |
| KR | 200163508 Y1 | 7/2000 |
| KR | 200206768 Y1 | 12/2000 |
| KR | 200236278 Y1 | 10/2001 |
| KR | 2002-0057425 A | 7/2002 |
| KR | 200286961 Y1 | 8/2002 |
| KR | 200366674 Y1 | 11/2004 |
| WO | WO2011059793 A2 | 5/2011 |
| WO | WO2012006620 A2 | 1/2012 |

OTHER PUBLICATIONS

The Free Dictionary, Screw—Definition of screw by The Free Dictionary, Jun. 15, 2016, 1 Page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
CIVIQ Smartscapes, FlexVue Ferro 55P/55L, Mar. 16, 2017, 4 pages.
CIVIQ, Invalidity Contentions, Jan. 24, 2018, 51 pages.
CIVIQ, Invalidity Claim Chart, Appendix E, Jan. 24, 2018, 28 pages.
CIVIQ, Invalidity Claim Chart, Appendix I, Mar. 22, 2018, 4 pages.

* cited by examiner description# ASSEMBLY FOR SUSPENDING AN ELECTRONIC DISPLAY

CROSS-REFERENCE TO RELATED APPLICATIONS

This application is a continuation of U.S. application Ser. No. 15/062,880 filed on Mar. 7, 2016, which is a continuation of U.S. application Ser. No. 14/553,086 filed on Nov. 25, 2014, now U.S. Pat. No. 9,282,676, the disclosures of all of which are hereby incorporated by reference in their entireties as if fully recited herein.

TECHNICAL FIELD

Embodiments of the present invention generally relate to mounting and cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise two separate flow paths for a fluid, such as air, through an electronic display. A first flow path may be a closed loop and a second flow path may be an open loop. The closed loop path circulating in a sealed electronics compartment defined by the back pan, a perimeter wall, and a rear cover. The closed loop may further circulate around and through partitions placed within the sealed electronics compartment. The second flow path may be an open loop defined by a channel between the back pan and the electronic display. The open loop may be configured to draw ambient gas (e.g. ambient air) through the display assembly and be exhausted out the display housing. Both the open and closed flow path may contain fans for moving the air.

Exemplary embodiments further comprise passageways configured to accommodate elongate members that extend through the housing. The passageways may be placed outside of the sealed electronics compartment and further comprise at least one clamp placed within each passageway. The clamps may be configured to accommodate the elongate members and suspend the assembly from a support, such as from a frame.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
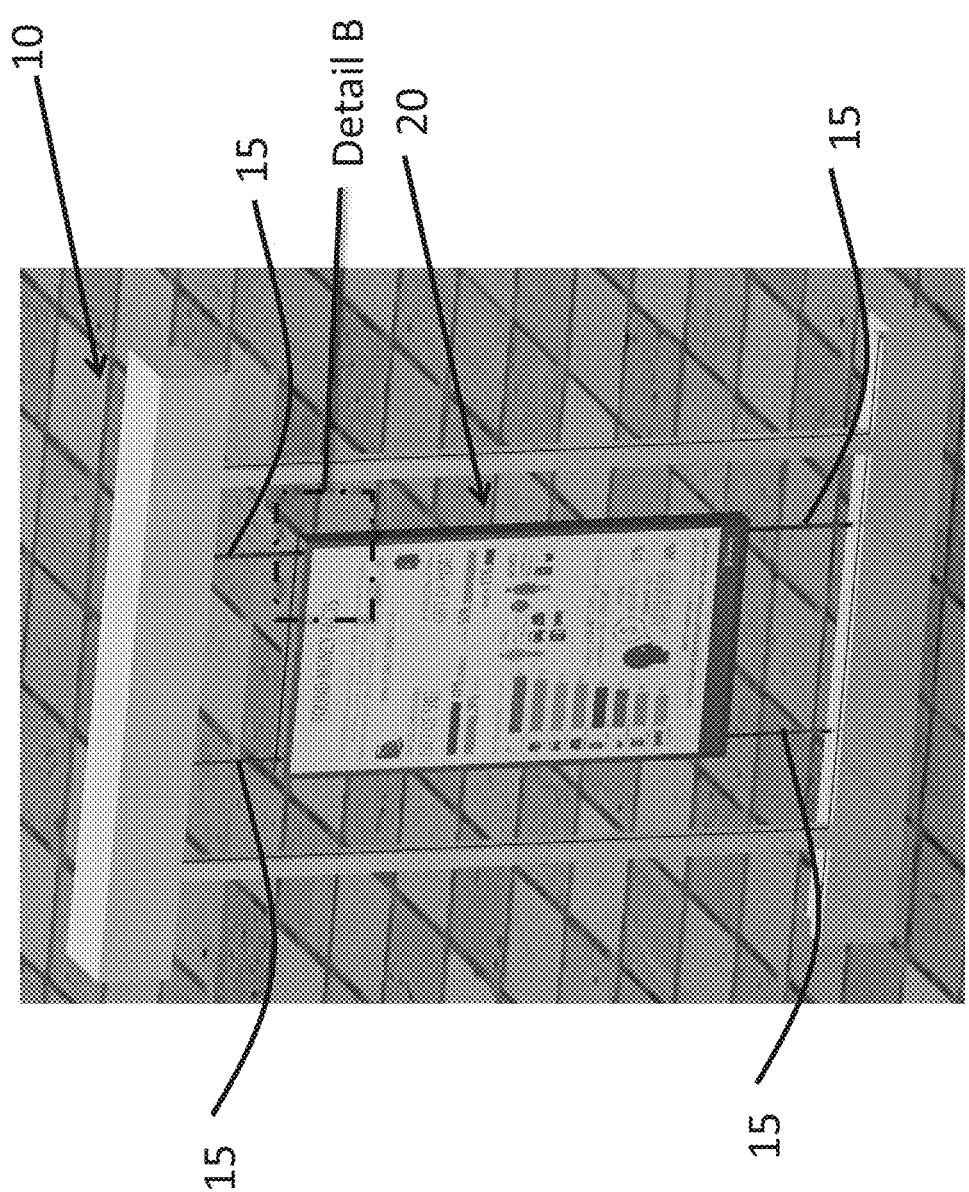
FIG. 1 is a front perspective view of the electronic display assembly housed in a frame and showing the locations of Detail B.
Figure 2:
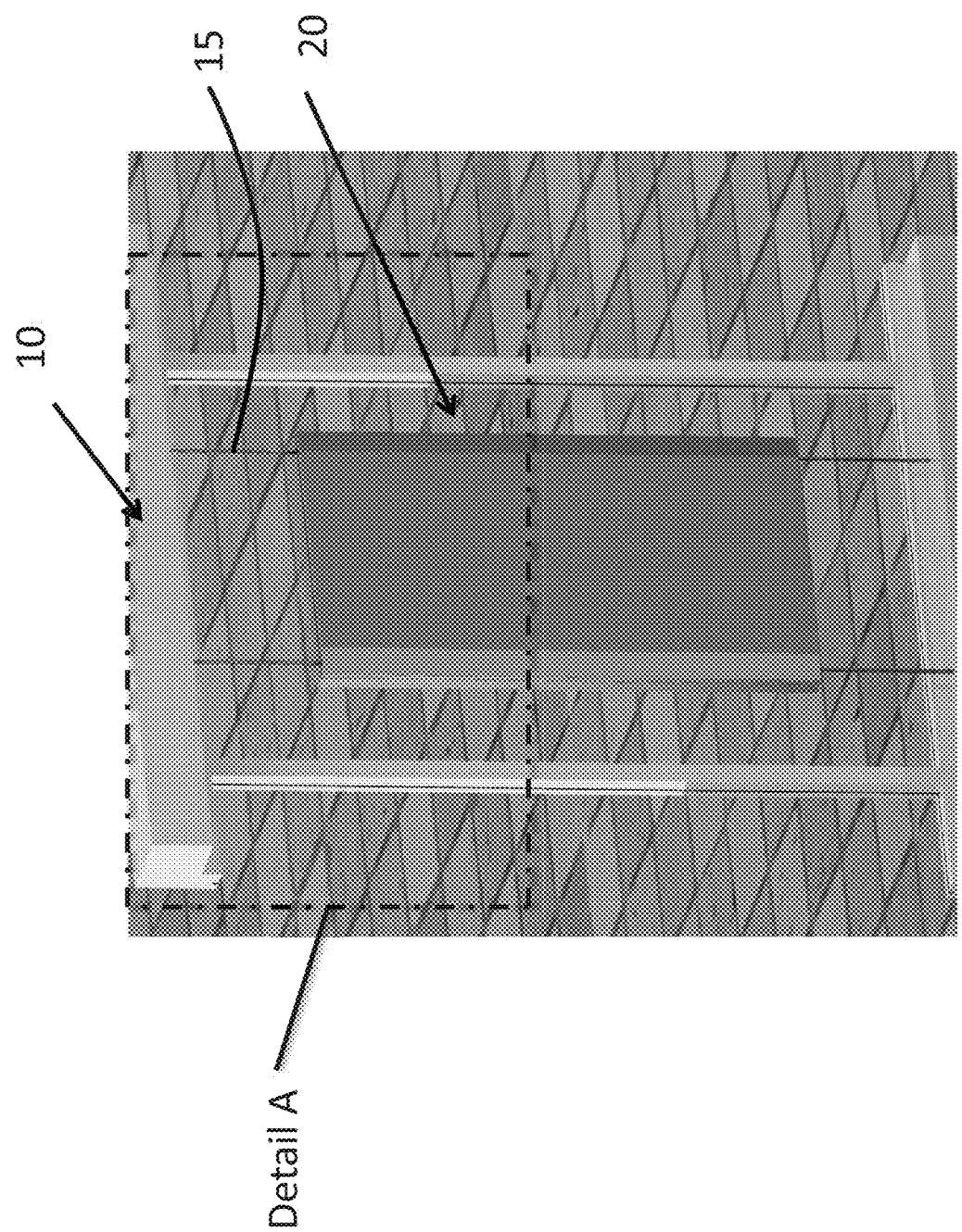
FIG. 2 is a rear perspective view of the electronic display assembly of FIG. 1 and showing the location of Detail A.
Figure 3:
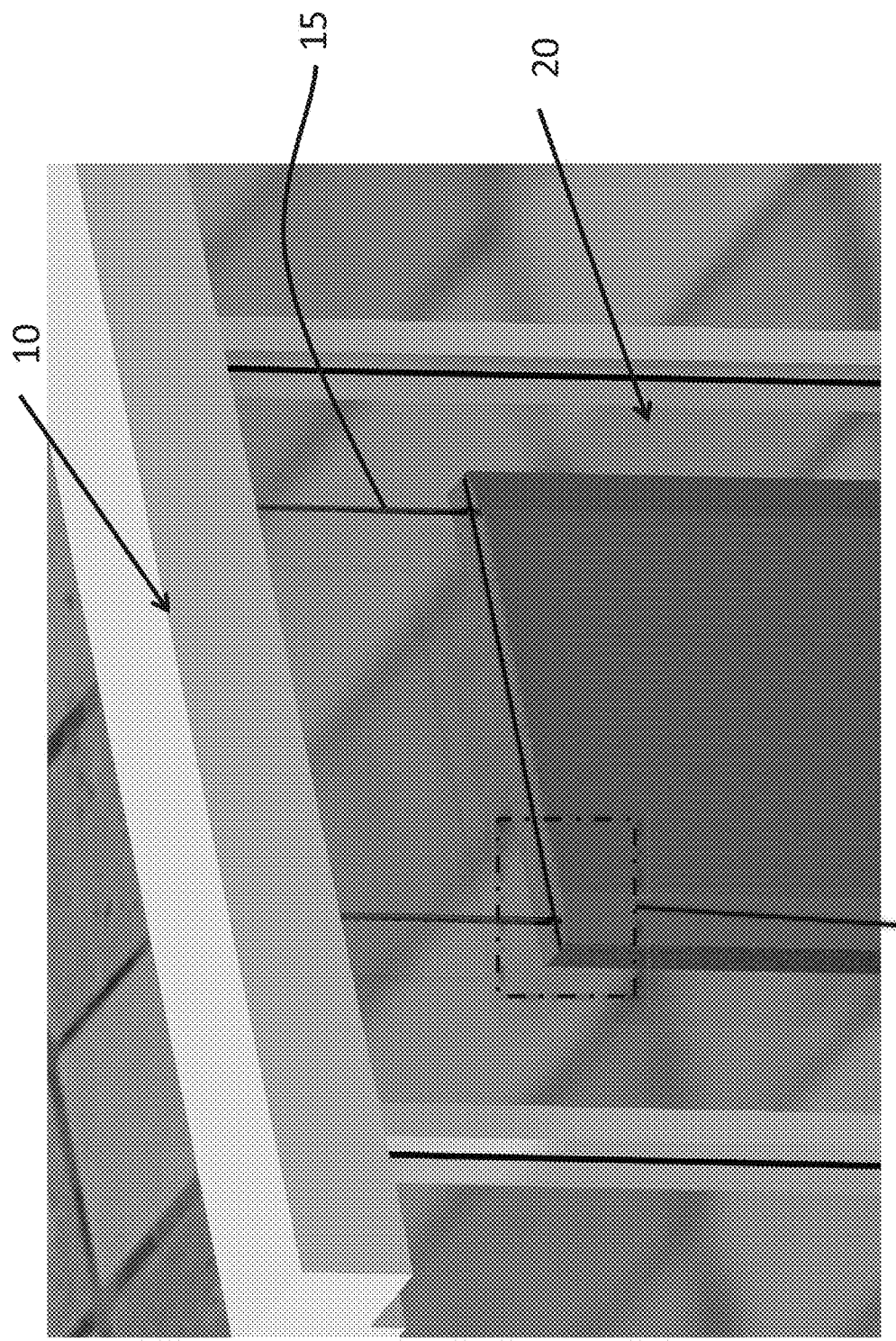
FIG. 3 is a detailed perspective view of Detail A shown in FIG. 2 and showing the location of Detail C.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a front perspective view of the electronic display assembly housed in a frame and showing the locations of Detail B. In an exemplary embodiment, an electronic display assembly 20 may be suspended from an upper support 10. The electronic display assembly 20 is preferably suspended from the upper support 10 by one or more elongate members 15. The upper support 10 may be configured such that the electronic display assembly 20 is suspended at or near a window. The electronic display assembly 20 may display information such as advertisements, marketing materials, directions, weather, maps, or other consumer media. The upper support 10 may be any fixture of the environment that is capable of supporting the weight of the electronic display assembly 20. In an exemplary embodiment, the upper support 10 may comprise a beam or ceiling joist that is oriented substantially horizontal and above the floor. In some embodiments, the upper support 10 may comprise a beam placed in the roof or ceiling or may be a free standing structure.

Figure 4:
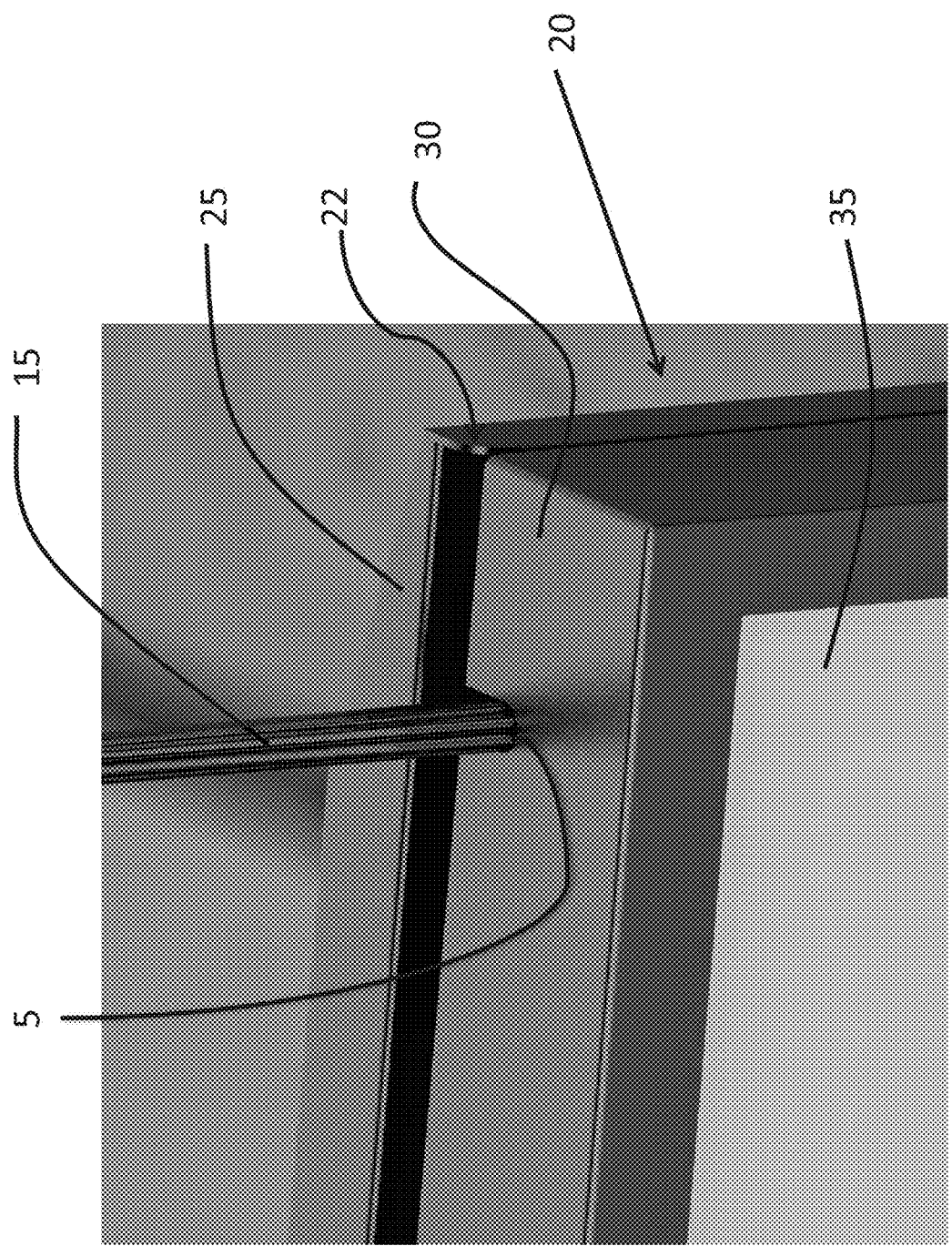
FIG. 4 is a detailed perspective view of Detail B shown in FIG. 1.

FIG. 4 is a detailed perspective view of Detail B shown in FIG. 1. The electronic display assembly 20 may be comprised of a front cover 30 and a rear cover 25. The front cover 30 may frame the display 35 and extend around at least a portion of the exterior sides of the assembly. The front cover may further comprise a slot 5 configured to accommodate the passage of elongate member 15. Elongate member 15 may be secured within the electronic display assembly 20. Rear cover 25 may be configured to extend over substantially the entire rear exterior and a portion of select exterior sides of the electronic display assembly 20. The front cover 30 and rear cover 25 are preferably configured to be assembled such that together they substantially surround and protect the electronic display 35 and related internal components while permitting the viewing of the display 35. Further, the front cover 30 and rear cover 25 may be configured to provide an aperture 22 running substantially the length of the top and bottom exterior sides of the electronic display assembly 20. The aperture 22 may be configured to permit the flow of the open loop fluid. In an exemplary embodiment, this open loop fluid is ambient air.

Figure 5:
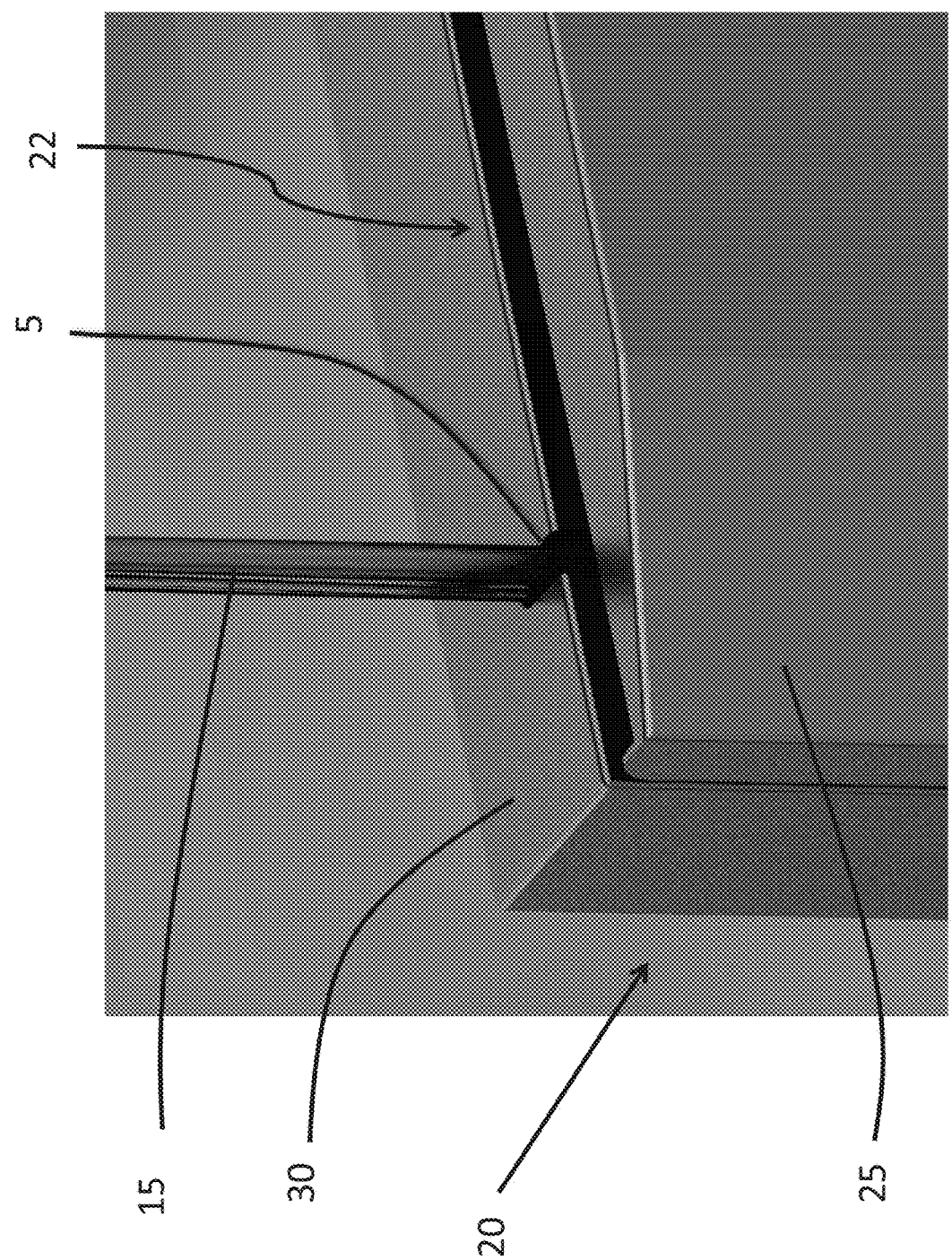
FIG. 5 is a detailed perspective view of Detail C shown in FIG. 3.

FIG. 5 illustrates a rear view of the device of FIG. 4. The elongate member 15 extends through front cover 30 via an accommodating slot 5.

Figure 6:
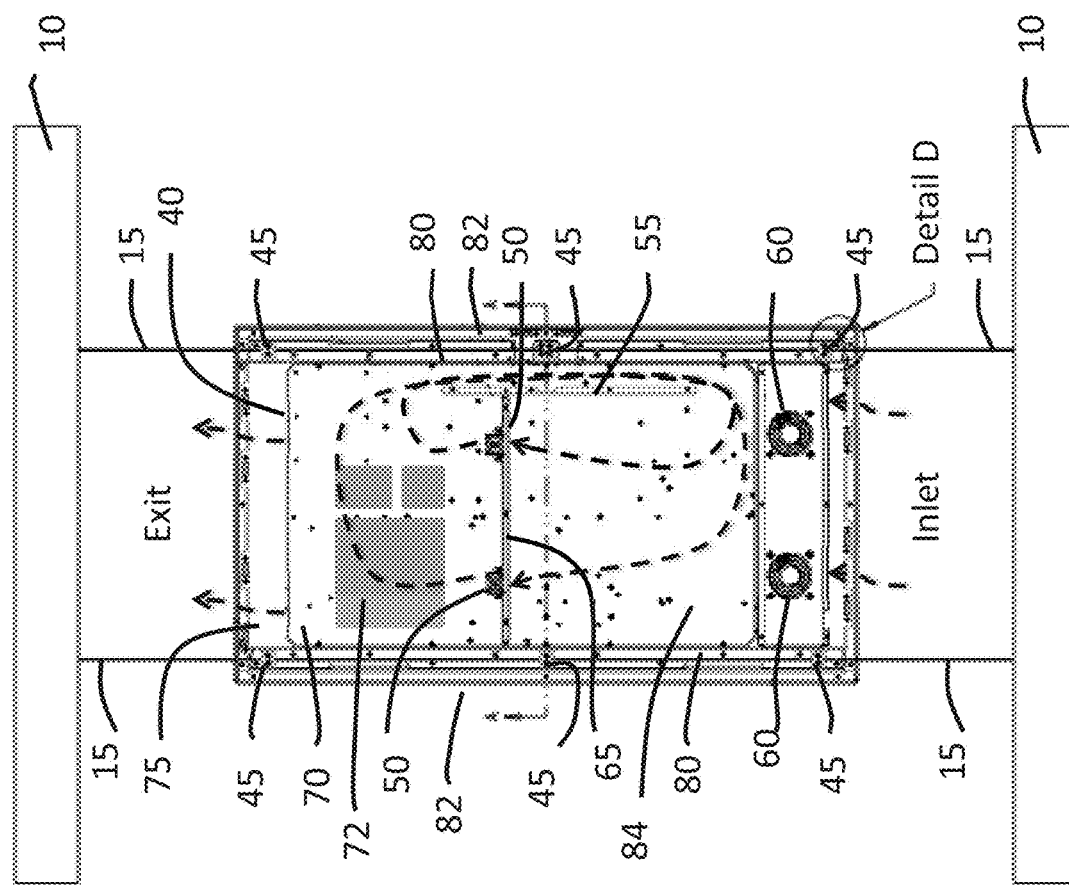
FIG. 6 is a rear planar view of the assembly of FIG. 1, illustrated with the rear cover removed and showing the location of section line A-A as well as Detail D.

FIG. 6 is a rear planar view of the assembly of FIG. 1, illustrated with the rear cover removed and showing the location of section line A-A as well as Detail D. This view illustrates some of the inner components of the assembly. The electronic display assembly 20 may be suspended from upper support 10 by at least one elongate member 15. These elongate members 15 preferably extend though the electronic display assembly 20 in passageways defined by the space between side walls 80 and exterior walls 82, and are secured therein, such as by clamps 45. This embodiment illustrates two elongate members 15, but other embodiments of the invention may contain any number of elongate members 15. Further, any number of clamps 45 are also contemplated.

From this view, a back pan 70 can be seen located behind a backlight 75. The rear cover 25, such as of FIG. 5, is not shown in the present figure in order to illustrate the interior components of this embodiment, however, rear cover 25 is generally placed behind the back pan 70 and atop a compartment side wall 80. The space between back pan 70, rear cover 25, and side wall 80 may define a sealed compartment 84 that comprises a closed loop for circulating fluid. The interior space may be defined by a side wall 80 which is placed around a perimeter of the back pan 70. In said closed loop, a fluid preferably circulates to distribute and transfer heat emanating from the interior electronic components 72 to the back pan 70.

The electronic components 72 illustrated are merely exemplary, any size, location, or number of components are contemplated. Said closed loop fluid may be air, preferably air that is free of particulate. Said closed loop may be further partitioned by a horizontal partition 65 and a vertical partition 55, which both preferably seal with the rear cover 25, when the rear cover 25 is placed atop the horizontal partition 65 and vertical partition 55. Said horizontal partition 65 and vertical partition 55 are preferably secured atop back pan 70 such that horizontal partition 65 adjoins vertical partition 55 perpendicularly and near an edge of horizontal partition 55.

As further illustrated in subsequent figures, the horizontal partition 65 and vertical partition 55 may be configured to partition the closed loop with select apertures in said partitions that permit and direct fluid flow through said apertures, thereby controlling and directing the circulation of the closed loop fluid. Any number of apertures are contemplated on both the horizontal partition 65 and the vertical partition 55. Fans 50 may be placed above select apertures to force the circulation of the closed loop fluids. Alternatively, the circulation may be accomplished by natural convection or quiescent flow. It is contemplated that any number of fans 50 may be used on any number of apertures on both the horizontal partition 65 and the vertical partition 55.

In the illustrated embodiment, the closed loop may primarily flow from an interior space below horizontal partition 65, via two fans 50 located atop apertures in the horizontal partition 65, and into an interior space above the horizontal partition 65, over the top edge of the vertical partition 55, down along a channel extending along the side of the vertical partition 55, and back into the interior space below the horizontal partition 65, thereby forming a continuous closed loop. While shown flowing in a clockwise direction here, embodiments could be counter-clockwise as well.

An open loop of fluid, such an ambient air, may be drawn into the bottom of the electronic display assembly 20 by fans 60 located at the bottom of the display. Alternatively, open loop fluid circulation may be accomplished by quiescent flow or natural convection. Any number of fans are contemplated. As will be explained in greater detail in subsequent figures, the fluid may then pass vertically through assembly 20 in an interior space between the back pan 70 and a rear surface of the backlight 75. The fluid may then be exhausted out the top of the assembly from a gap between the back pan 70 and the backlight 75 and outside the electronic display assembly 20 through aperture 22 between front cover 30 and rear cover 25 at the top of the electronic display assembly 20. The open loop may further comprise a filter, although not required, but could be located along the loop near the fans 60, to eliminate particulate from the circulating fluid, such as dust and moisture.

Figure 7:
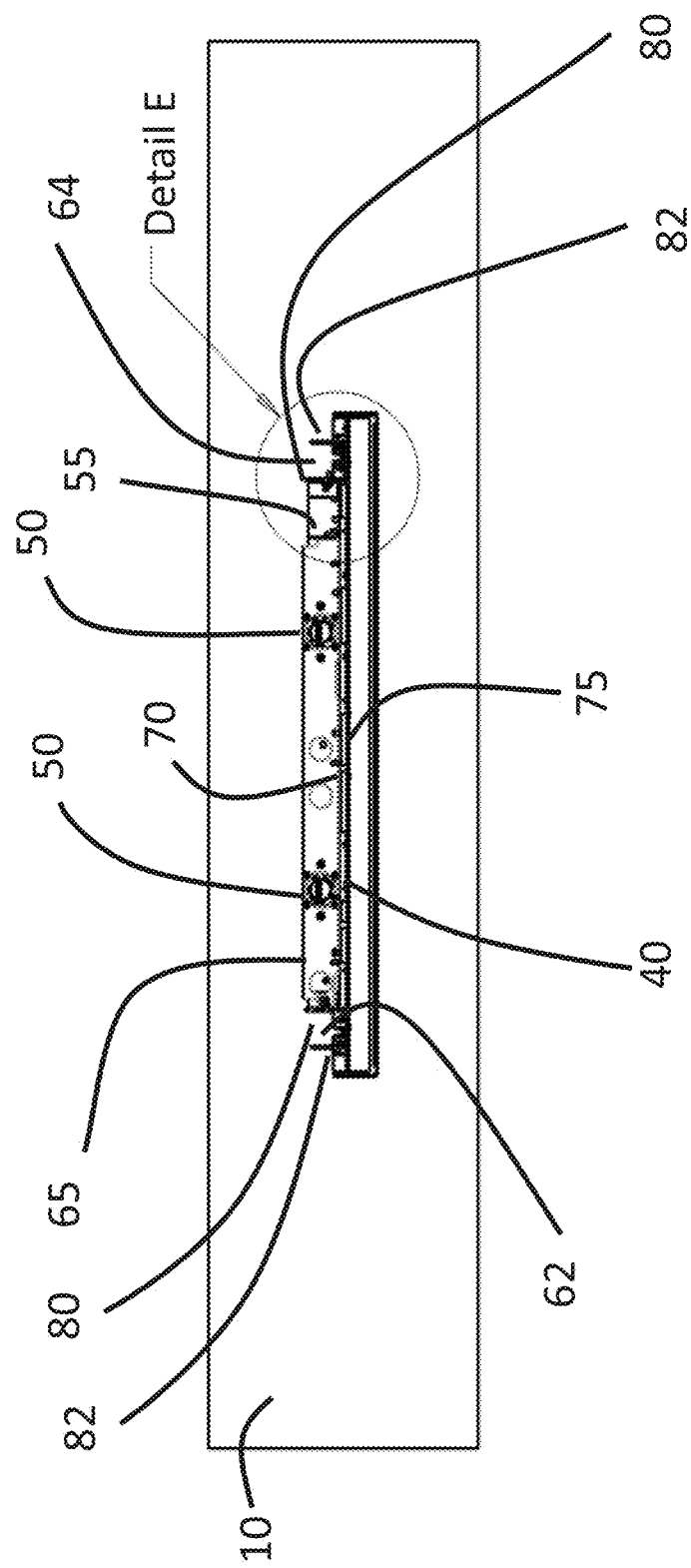
FIG. 7 is a cross sectional view of the assembly of FIG. 6 taken along section line A-A of and indicating Detail E.

Turning now to FIG. 7, the interior space defining the closed loop may be further defined by side walls 80, which preferably seal the closed loop when the rear cover 25 is in place to prevent ambient air, moisture, and particulate from entering the closed loop cavity. The horizontal partition 65 blocks a portion of the airflow in the closed loop such that the airflow is directed from a bottom chamber to a top chamber through the horizontal partition 65 via select apertures therein. The select apertures may additionally comprise fans 50 atop said apertures to direct and stimulate airflow. The closed loop airflow is further directed by vertical partition 55, which blocks a portion of the closed loop airflow and may direct said airflow through select apertures therein. The side channel extends from the lower to the upper chamber and completes the closed loop. Passageways 62 and 64 are defined by side walls 80 and exterior walls 82 on each respective side and permit the passage of elongate members 15, as is further detailed herein.

Figure 8:
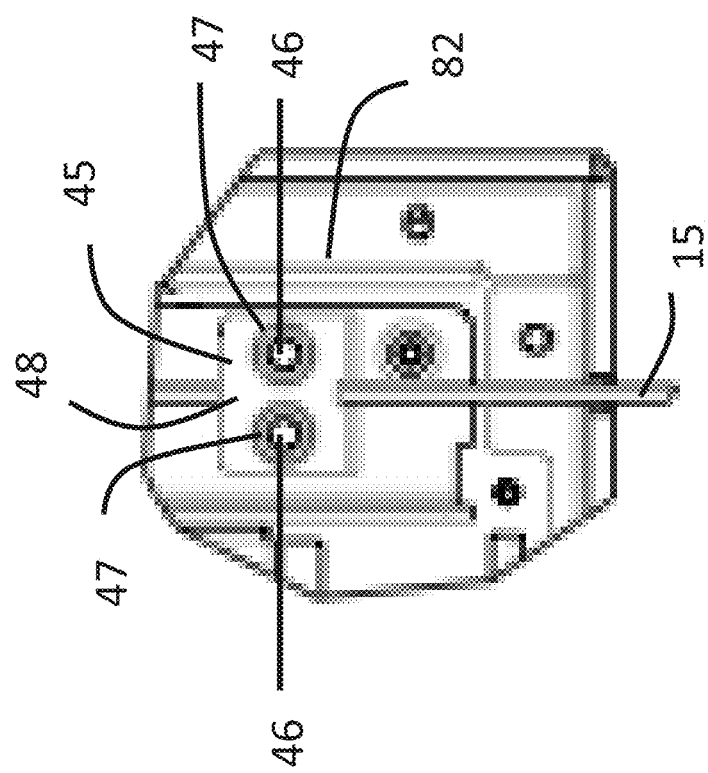
FIG. 8 is a rear detailed view of Detail D shown in FIG. 6.

FIG. 8 illustrates how the electronic display assembly 20 can be, optionally, suspended by elongate members 15 and secured by clamps 45. The elongate member 15 may run through passageways 62 and 64 located on the sides of the assembly, inside exterior walls 82, and be attached therein by clamps 45. Any number of clamps 45 are contemplated. Referring additionally to FIG. 1 and FIG. 6, preferably, in this embodiment, a pair of clamps 45 secure the elongate members 15 near the top of the assembly 20, another pair of clamps 45 secure the elongate members 15 at approximately the midpoint of the assembly 20, and a final pair of clamps 45 secure the elongate members 15 near the bottom of the assembly 20. In one embodiment, the clamps 45 comprise a plate 48 configured to accommodate the passage of elongate members 15 beneath the plate and a pair of mounting apertures 47 passing through the plate. The mounting apertures 47 may permit a securing member, such as a threaded fastener 46, to pass through and be secured to the assembly 20 (when the fastener 46 and plate 48 draw against the front cover 25, rear cover 30, or the display 35). As the threaded fastener 46 is tightened, the clamps 45 may frictionally engage the elongate members 15 to secure the elongate members 15. The elongate members 15 may be made of a suitably high tensile strength material, such as metallic cable or wire rope. The clamps 45 may be made of a suitably strong material, such as a metal, polymer, or composite.

Figure 9:
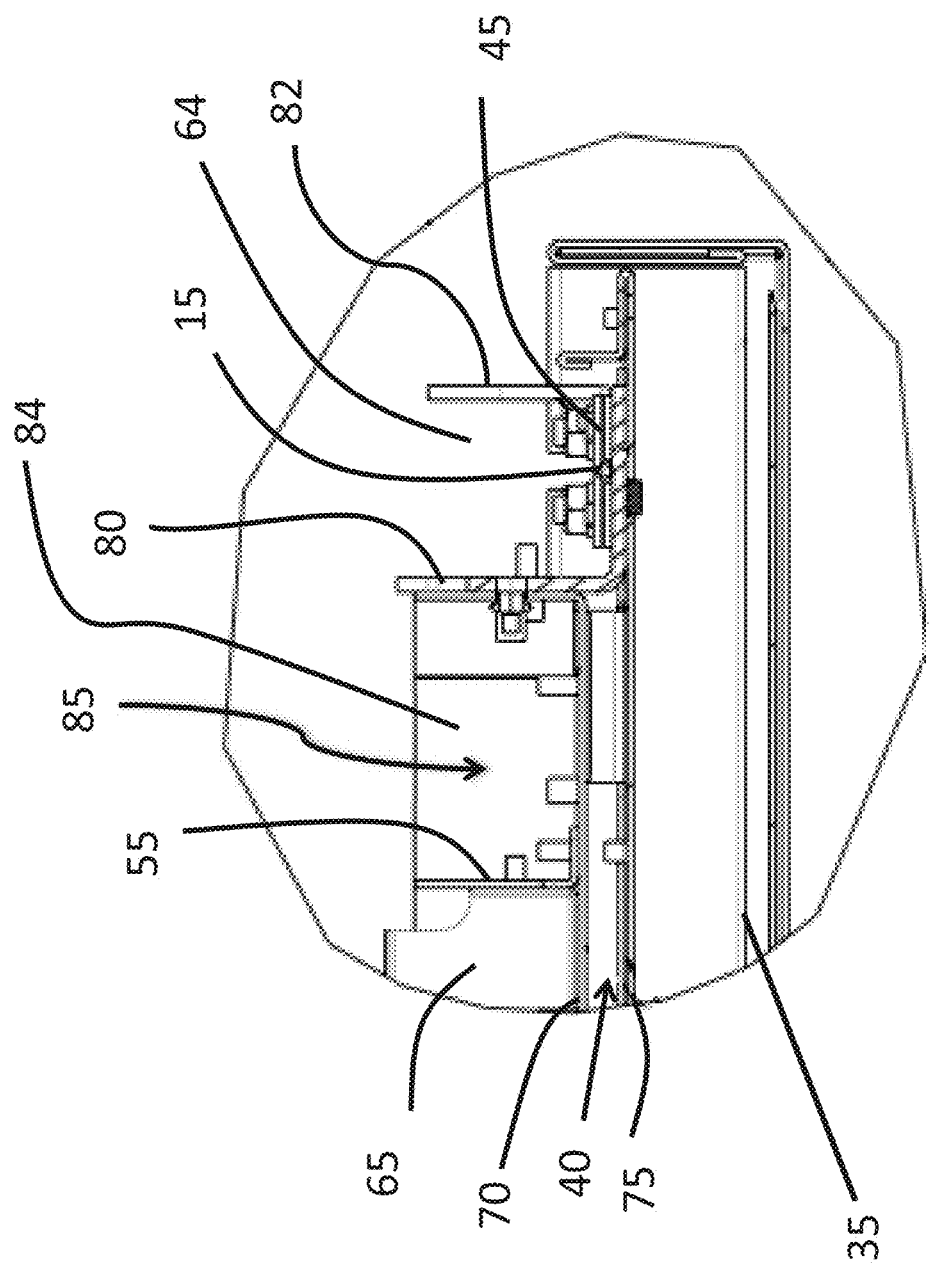
FIG. 9 is a detailed section view of Detail E shown in FIG. 7.

FIG. 9 The open loop may be defined by a channel, indicated generally at 40, extending between the back pan 70 and the backlight 75. Said channel 40 extends substantially vertically between the top and bottom of the electronic display assembly 20. The closed loop may be defined by the space defined between the back pan 70, rear cover 25, and on the sides by side walls 80 which may surround the sealed compartment 84. The horizontal partition 65 preferably lies atop the back pan 70 and is preferably oriented substantially perpendicular to the back pan 70. Vertical partition 55 may extend substantially perpendicular to and adjoins a side of horizontal partition 65. Side wall 80 preferably seals and encloses the sealed compartment 84. The side channel, indicated generally at 85, is defined by the space between vertical partition 55 and side wall 80. As previously illustrated, elongate member 15 extends through the electronic display assembly 20 via passageway 64 defined by the space between side walls 80 and exterior walls 82, and is secured therein by clamps 45.

Figure 10:
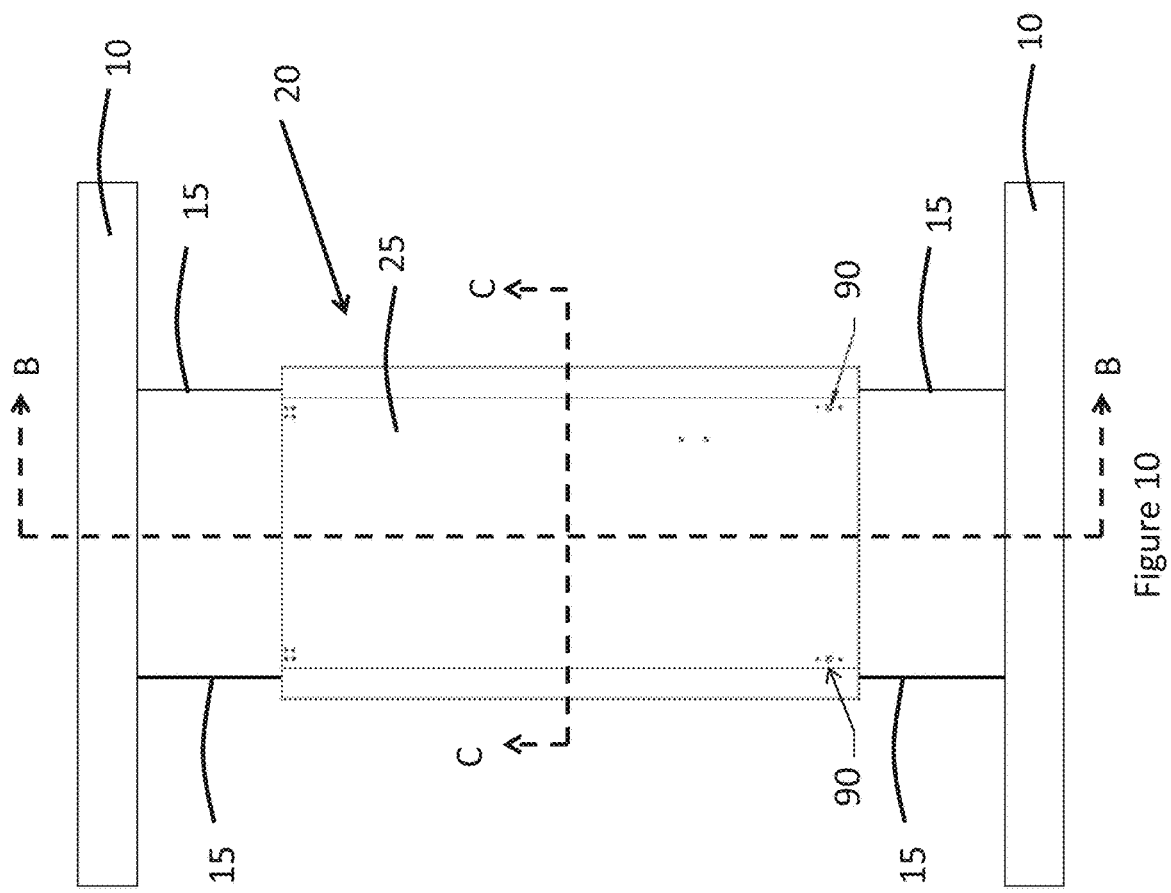
FIG. 10 is a rear planar view of the assembly of FIG. 1, illustrated with the rear cover in place and indicating section lines B-B and C-C.
Figure 11:
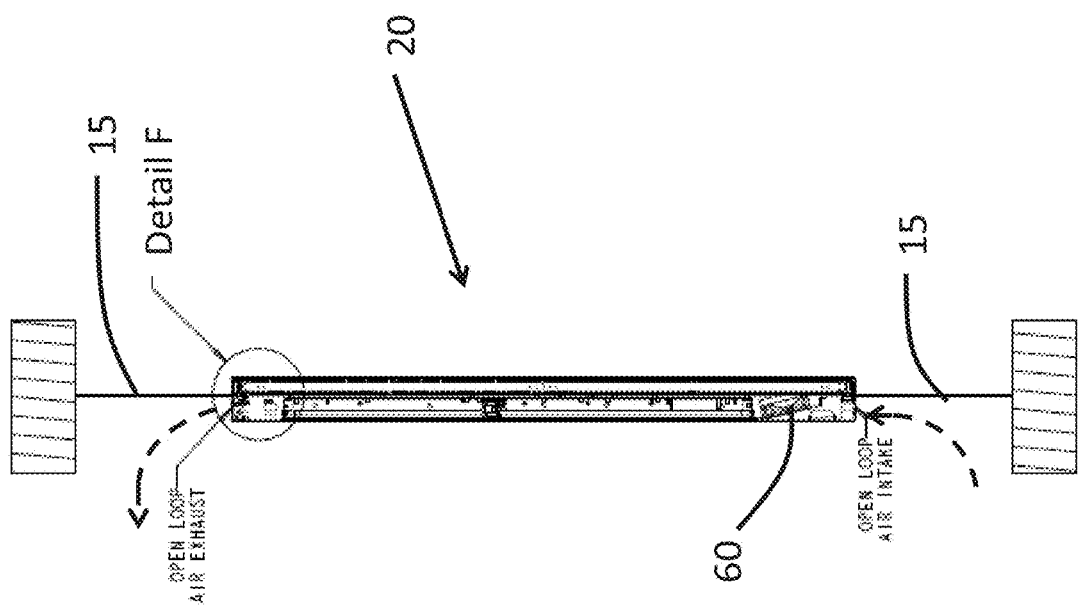
FIG. 11 is a cross sectional view of the assembly of FIG. 10 taken along section line B-B of and indicating Detail F.

FIG. 10 is substantially the same as FIG. 6 with the rear cover 25 in place. FIG. 10 illustrates a rear view of the electronic display assembly with the rear cover 25 in place. The rear cover 25 covers substantially the entirety of the rear of the electronic display assembly 20. The elongate members 15 preferably extend from the supports 10 through the electronic display assembly 20. The rear cover 25 is secured in place by a securing mechanism, such as spring locks 90. Alternatively, other securing mechanisms such as threaded fasteners, pins, hooks, slots, and the like may be used to secure rear cover 25 in place.

Elongate member 15 preferably passes through the entirety of the electronic display assembly 20. Alternatively, multiple elongate members 15 may be utilized which terminate within the electronic display assembly 20.

Figure 12:
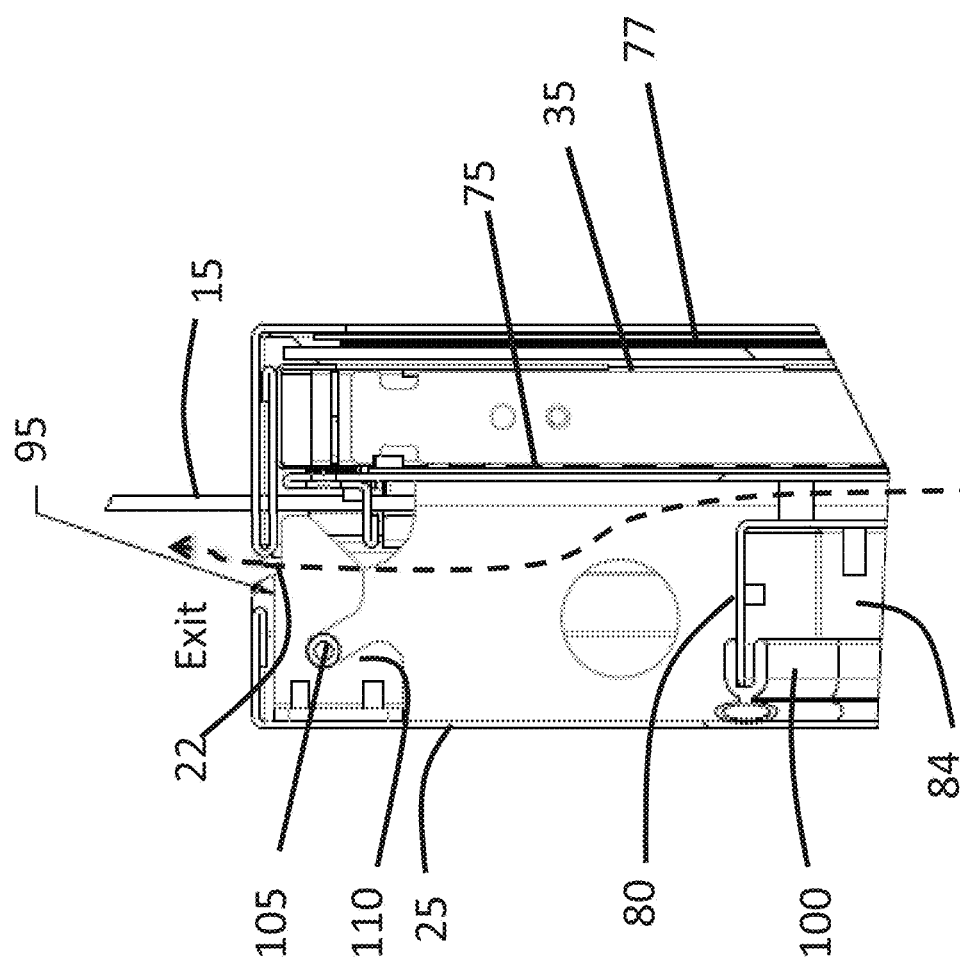
FIG. 12 is a detailed view of Detail F shown in FIG. 11.

Referring additionally now to FIG. 12, the open loop exhaust can be seen exiting the top of the electronic display assembly via aperture 22. Hook bracket 95 is secured to rear cover 25. The hook bracket 95 contains an accommodating slot 110 that accommodates a side rail 105, thereby securing the rear cover 25 in place. Any bracket configuration and accommodating slot design is contemplated. Alternatively, other securing mechanisms such as threaded fasteners, pins, or the like are contemplated.

The rear cover 25, in part, defines the rear wall of the sealed compartment 84, as previously explained. The rear cover 25 may comprise a closed loop gasket 100, which is preferably sandwiched between the side wall 80 and the rear cover 25. The closed loop gasket 100 may be sandwiched between the side wall 80 and the bottom surface of rear cover 25, thereby preferably creating an air-tight seal. The closed loop gasket 100 may be comprised of rubber, silicone, a polymer, or compounds thereof. Alternatively, any other suitably flexible and impermeable material may be utilized. The shape of the illustrated closed loop gasket 100 is merely exemplary, other known gasket shapes and designs are contemplated. Alternatively, the side walls 80 may have an integrated gasket. Further still, the side wall 80 may extend to the bottom surface of the rear cover 25 with a possible interference fit, thereby sealing the closed loop and no gasket is required. Some embodiments may place a protective transparent plate 77 in front of the display 35, which could be glass, plastic, or a composite material.

Figure 13:
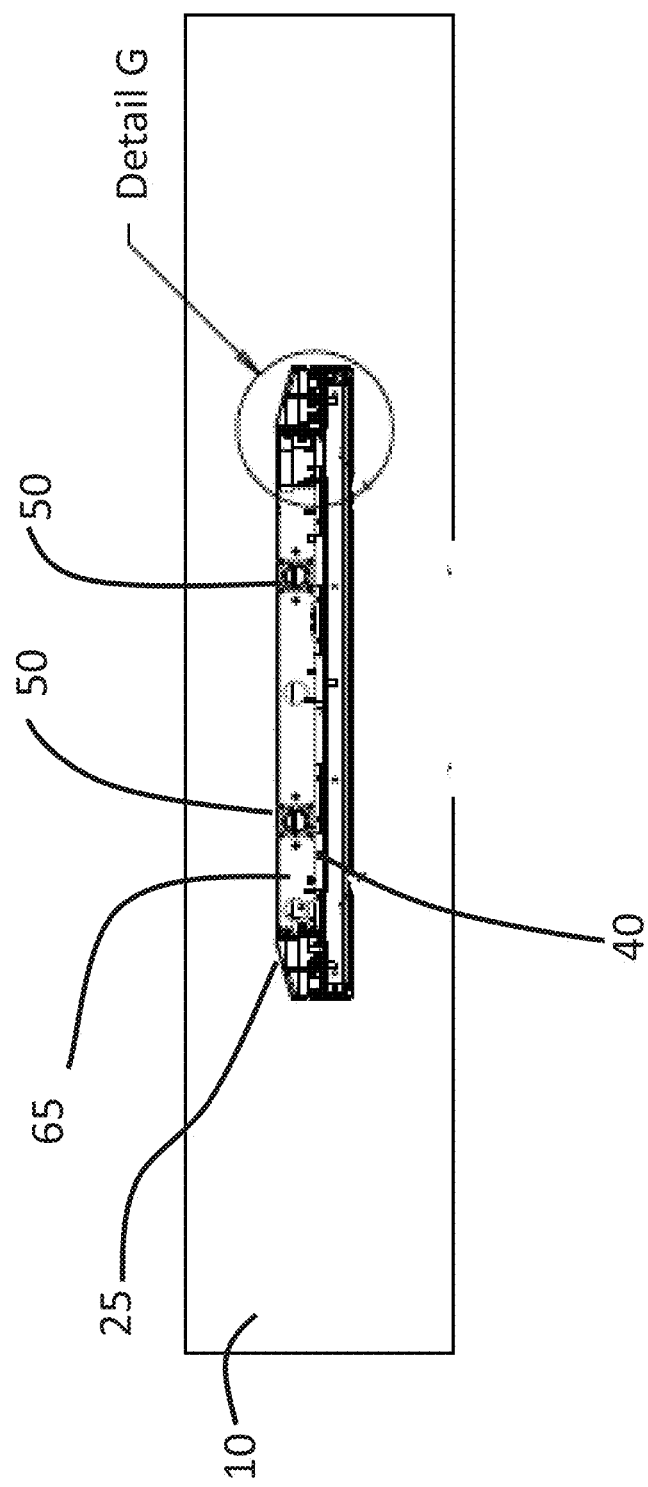
FIG. 13 is a cross sectional view of the assembly of FIG. 10 taken along section line CC of and indicating Detail G.

FIG. 13 is substantially similar to FIG. 7, except the rear cover 25 is in place, which preferably covers substantially the entirety of the rear of the assembly.

Figure 14:
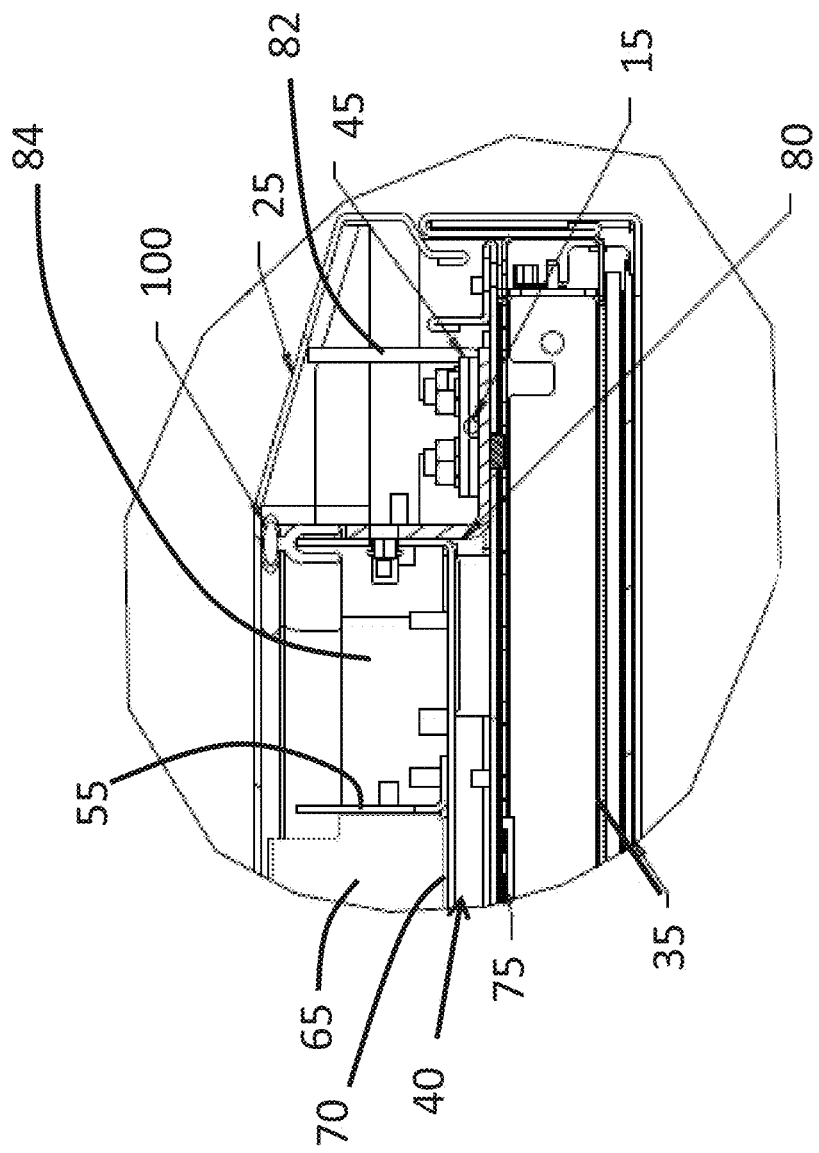
FIG. 14 is a detailed view of Detail G shown in FIG. 13.

FIG. 14 is substantially similar to FIG. 9, except the rear cover 25 is in place and may further define the sealed compartment 84. Closed loop gasket 100, if used, preferably extends between the top edge of side wall 80 and the front surface of the rear cover 25, thereby creating an air-tight seal, further defining the closed loop.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clockwise or counterclockwise direction. Further, the open loop may also be horizontal or vertical and can run left to right, right to left, and top to bottom, or bottom to top.

The display 35 can be any type of electronic display, but is preferably a flat panel electronic display. An exemplary embodiment may include a liquid crystal display as the display 35 and preferably would be a direct LED backlit LCD display, but could also be an OLED, plasma, or electroluminescent polymer.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. An assembly for suspending an electronic display between a first structure located above the electronic display and a second structure located below the electronic display, said assembly comprising:
 a housing for the electronic display;
 a plurality of elongate members, each of which extends through the housing and are configured to extend from the first structure to the second structure;
 a substantially sealed compartment for circulating gas positioned within the housing;
 a channel extending through the housing, in thermal communication with the substantially sealed compartment, and configured to receive ambient air; and
 a plurality of clamps, each of which is located within the housing and is sized to accept one of the elongate members.

2. The assembly of claim 1 wherein:
 said sealed compartment is located behind the electronic display.

3. The assembly of claim 2 wherein:
 said sealed compartment is located entirely behind the electronic display.

4. The assembly of claim 2 wherein:
 the channel is located between a rear surface of the electronic display and a front surface of the substantially sealed compartment.

5. The assembly of claim 4 wherein:
 the channel extends along a backlight for the electronic display.

6. The assembly of claim 1 wherein:
 the first vertical passageway extends along a left side of the electronic display;
 the second vertical passageway extends along a right side of the electronic display; and
 at least one clamp is located in each of the first and second vertical passageways.

7. The assembly of claim 1 further comprising:
 a fan located within the substantially sealed compartment; and
 a partition located within the substantially sealed compartment.

8. The assembly of claim 1 further comprising:
 a fan positioned to draw ambient air into the channel.

9. The assembly of claim 1 wherein:
 the substantially sealed compartment comprises a back pan, a wall, and a rear cover.

10. The assembly of claim 1 further comprising:
 one or more electronic components for operating the electronic display located within the substantially sealed compartment.

11. The assembly of claim 1 wherein:
 each of said plurality of elongate members comprises a cable.

12. The assembly of claim 1 wherein:
 each of said clamps comprise:
  a plate, and
  at least one aperture configured to receive a fastener.

13. An assembly for suspending an electronic display between a first structure located above the electronic display and a second structure located below the electronic display, said assembly comprising:
 a housing for said electronic display;
 a substantially sealed compartment positioned within said housing;
 a first and second vertical passageway extending through the housing along either side of the electronic display;
 a plurality of elongate members, each of which extends through one of said first and second vertical passageways and is configured to be secured on a first end thereof to the first structure and is configured to be secured on a second end thereof to the second structure; and
 a first and second clamp, each of which is located in one of the first and second vertical passageways, sized to accommodate one of the elongate members, and configured to secure the respective elongate member to the housing.

14. The assembly of claim 13 wherein:
 the substantially sealed compartment is located behind the electronic display and comprises one or more electronic components for operating the electronic display.

15. The assembly of claim 13 further comprising:
 a channel located between a rear surface of the electronic display and a front surface of the substantially sealed compartment.

16. The assembly of claim 13 wherein:
 each of said elongate members comprises a cable.

17. An assembly for suspending an electronic display between a first structure located above the electronic display and a second structure located below the electronic display, said assembly comprising:
 a housing for said electronic display;
 a channel extending through the housing and configured to receive ambient air;
 a first and second vertical passageway extending through the housing and along either side of the electronic display;
 a plurality of elongate members, each of which extends through one of the vertical passageways and is configured to be secured on a first end thereof to the first structure and is configured to be secured on a second end thereof to the second structure; and
 a first and second clamp, each of which is located in one of the vertical passageways, is sized to accommodate one of the elongate members, and is configured to secure the respective elongate member to the housing.

18. The assembly of claim 17 further comprising;
 a substantially sealed compartment located behind a rear surface of the electronic display.

19. The assembly of claim 17 wherein:
 the channel is located between a rear surface of the electronic display and a front surface of the substantially sealed compartment.

20. The assembly of claim 17 further comprising:
 one or more electronic components for operating the electronic display located within the substantially sealed compartment.

* * * * *